(12) United States Patent
Liu et al.

(10) Patent No.: US 10,371,802 B2
(45) Date of Patent: Aug. 6, 2019

(54) SYSTEMS AND METHODS FOR OPTICAL DISTANCE MEASUREMENT

(71) Applicant: SZ DJI TECHNOLOGY CO., LTD., Shenzhen (CN)

(72) Inventors: Xiang Liu, Shenzhen (CN); Mingming Gao, Shenzhen (CN); Xiaoping Hong, Shenzhen (CN); Di Wu, Shenzhen (CN)

(73) Assignee: SZ DJI Technology Co., Ltd., Guangdong (CN)

( * ) Notice: Subject to any disclaimer, the term of this patent is extended or adjusted under 35 U.S.C. 154(b) by 0 days.

(21) Appl. No.: 15/944,729

(22) Filed: Apr. 3, 2018

(65) Prior Publication Data
US 2019/0025413 A1    Jan. 24, 2019

Related U.S. Application Data

(63) Continuation of application No. PCT/CN2017/093688, filed on Jul. 20, 2017.

(51) Int. Cl.
*G01C 3/08* (2006.01)
*G01S 7/486* (2006.01)
(Continued)

(52) U.S. Cl.
CPC ........... *G01S 7/4861* (2013.01); *G01S 17/10* (2013.01); *H03K 5/133* (2013.01); *H03K 19/017581* (2013.01); *H03K 5/24* (2013.01)

(58) Field of Classification Search
CPC ....... G01S 7/4861; G01S 17/10; H03K 5/133; H03K 19/017581; H03K 5/24
See application file for complete search history.

(56) References Cited

U.S. PATENT DOCUMENTS

| 4,283,116 A | 8/1981 | Weis |
| 5,179,565 A | 1/1993 | Tsuchiya et al. |

(Continued)

FOREIGN PATENT DOCUMENTS

| CN | 101216562 A | 7/2008 |
| CN | 101256232 | 9/2008 |

(Continued)

OTHER PUBLICATIONS

Aijazi et al., "Segmentation Based Classification of 3D Urban Point Clouds: A Super-Voxel Based Approach with Evaluation," (2013), 27 pages.

(Continued)

*Primary Examiner* — Samantha K Abraham
(74) *Attorney, Agent, or Firm* — Finnegan, Henderson, Farabow, Garrett & Dunner, LLP

(57) ABSTRACT

Systems and methods for performing optical distance measurement are provided. In one aspect, a system for measuring a distance to an object comprises a light emitter configured to emit an outbound light pulse, and a light sensor configured to receive a returning light pulse reflected from the object and output an analog pulse signal representing the returning light pulse. The system also comprises a field-programmable gate array (FPGA) coupled to the light sensor. The FPGA is configured to convert the analog pulse signal to a plurality of digital signal values, and generate a plurality of time measurements corresponding to the plurality of digital signal values. The system also comprises a controller configured to calculate the distance to the object based on the plurality of digital signal values and the plurality of time measurements.

22 Claims, 12 Drawing Sheets

(51) Int. Cl.
  *G01S 17/10* (2006.01)
  *H03K 5/133* (2014.01)
  *H03K 19/0175* (2006.01)
  *H03K 5/24* (2006.01)

(56) References Cited

U.S. PATENT DOCUMENTS

| | | |
|---|---|---|
| 5,249,046 A | 9/1993 | Ulich et al. |
| 6,101,455 A | 8/2000 | Davis |
| 6,246,258 B1 | 6/2001 | Lesea |
| 6,344,937 B1 | 2/2002 | Sparrold et al. |
| 6,666,855 B2 | 12/2003 | Somani et al. |
| 7,085,400 B1 | 8/2006 | Holsing et al. |
| 7,236,299 B1 | 6/2007 | Smith et al. |
| 7,336,407 B1 | 2/2008 | Adams et al. |
| 7,564,571 B2 | 7/2009 | Karabassi et al. |
| 7,843,448 B2 | 11/2010 | Wheeler et al. |
| 7,899,598 B2 | 3/2011 | Woon et al. |
| 8,224,097 B2 | 7/2012 | Matei et al. |
| 8,396,293 B1 | 3/2013 | Korah et al. |
| 8,488,877 B1 | 7/2013 | Owechko et al. |
| 8,503,046 B2 | 8/2013 | Mikkelsen et al. |
| 8,605,998 B2 | 12/2013 | Samples et al. |
| 8,620,089 B1 | 12/2013 | Korah et al. |
| 8,665,122 B2 | 3/2014 | Klepsvik |
| 8,773,182 B1 | 7/2014 | Degani et al. |
| 8,798,372 B1 | 8/2014 | Korchev et al. |
| 9,076,219 B2 | 7/2015 | Cha et al. |
| 9,097,804 B1 | 8/2015 | Silver et al. |
| 9,098,753 B1 | 8/2015 | Zhu et al. |
| 9,128,190 B1 | 9/2015 | Ulrich et al. |
| 9,369,697 B2 | 6/2016 | Kumagai et al. |
| 9,383,753 B1 | 7/2016 | Templeton et al. |
| 9,396,545 B2 | 7/2016 | Fu et al. |
| 9,470,548 B2 | 10/2016 | Ahn et al. |
| 9,584,748 B2 | 2/2017 | Saito |
| 9,644,857 B1 | 5/2017 | Ashgriz et al. |
| 9,659,378 B2 | 5/2017 | Sasaki et al. |
| 2002/0065620 A1 | 5/2002 | Drinkard et al. |
| 2004/0135992 A1 | 7/2004 | Munro |
| 2005/0248749 A1 | 11/2005 | Kiehn et al. |
| 2005/0254628 A1 | 11/2005 | Saladin et al. |
| 2007/0214687 A1 | 9/2007 | Woon et al. |
| 2007/0296954 A1 | 12/2007 | Kuijk et al. |
| 2008/0114253 A1 | 5/2008 | Randall et al. |
| 2008/0319706 A1 | 12/2008 | Uffenkamp et al. |
| 2009/0310867 A1 | 12/2009 | Matei et al. |
| 2010/0271615 A1 | 10/2010 | Sebastian et al. |
| 2011/0285981 A1 | 11/2011 | Justice et al. |
| 2012/0032541 A1 | 2/2012 | Chen et al. |
| 2012/0121166 A1 | 5/2012 | Ko et al. |
| 2012/0170024 A1 | 7/2012 | Azzazy et al. |
| 2012/0170029 A1 | 7/2012 | Azzazy et al. |
| 2012/0248288 A1 | 10/2012 | Linder et al. |
| 2012/0256916 A1 | 10/2012 | Kitamura et al. |
| 2013/0107243 A1 | 5/2013 | Ludwig et al. |
| 2013/0188766 A1 | 7/2013 | Williams |
| 2013/0284475 A1 | 10/2013 | Hirabayashi et al. |
| 2013/0329065 A1 | 12/2013 | Haraguchi et al. |
| 2014/0049765 A1 | 2/2014 | Zheleznyak et al. |
| 2014/0071121 A1 | 3/2014 | Russ et al. |
| 2014/0132723 A1 | 5/2014 | More |
| 2014/0368651 A1 | 12/2014 | Irschara et al. |
| 2015/0109024 A1* | 4/2015 | Abdelfattah ........ G06F 17/5054 326/41 |
| 2015/0185313 A1 | 7/2015 | Zhu |
| 2015/0206023 A1 | 7/2015 | Kochi et al. |
| 2015/0219920 A1 | 8/2015 | Ando et al. |
| 2016/0070981 A1 | 3/2016 | Sasaki et al. |
| 2016/0080138 A1* | 3/2016 | Biederman ........... H04L 7/0037 375/354 |
| 2016/0154999 A1 | 6/2016 | Fan et al. |
| 2016/0311528 A1 | 10/2016 | Nemovi et al. |
| 2016/0327779 A1 | 11/2016 | Hillman |
| 2017/0046840 A1 | 2/2017 | Chen et al. |
| 2017/0046845 A1 | 2/2017 | Boyle et al. |
| 2017/0090019 A1 | 3/2017 | Slobodyanyuk et al. |
| 2017/0153319 A1 | 6/2017 | Villeneuve et al. |
| 2017/0155225 A1 | 6/2017 | Villeneuve et al. |
| 2017/0178352 A1 | 6/2017 | Harmsen et al. |
| 2017/0227628 A1 | 8/2017 | Zheleznyak et al. |
| 2017/0248698 A1 | 8/2017 | Sebastian et al. |
| 2017/0316701 A1 | 11/2017 | Gil et al. |

FOREIGN PATENT DOCUMENTS

| | | |
|---|---|---|
| CN | 202182717 U | 4/2012 |
| CN | 102508255 | 6/2012 |
| CN | 102944224 A | 2/2013 |
| CN | 102971657 | 3/2013 |
| CN | 103257342 A | 8/2013 |
| CN | 103257348 A | 8/2013 |
| CN | 103403577 A | 11/2013 |
| CN | 103499819 | 1/2014 |
| CN | 103969637 A | 8/2014 |
| CN | 103983963 A | 8/2014 |
| CN | 104463872 A | 3/2015 |
| CN | 104600902 A | 5/2015 |
| CN | 105517903 A | 4/2016 |
| CN | 105628026 A | 6/2016 |
| CN | 105759253 A | 7/2016 |
| CN | 106019296 A | 10/2016 |
| CN | 106019923 A | 10/2016 |
| CN | 106030431 | 10/2016 |
| CN | 106063089 A | 10/2016 |
| CN | 106093958 | 11/2016 |
| CN | 106093963 A | 11/2016 |
| CN | 106199622 A | 12/2016 |
| CN | 106597414 A | 4/2017 |
| CN | 106597416 A | 4/2017 |
| CN | 203645633 | 6/2017 |
| CN | 107037721 A | 8/2017 |
| DE | 10 2015 103 472 A1 | 9/2016 |
| JP | 63194211 A | 8/1988 |
| JP | 2002199682 A | 7/2002 |
| JP | 2005321547 A | 11/2005 |
| JP | 2015200555 A | 11/2015 |
| JP | 6076541 | 2/2017 |
| KR | 101665938 B1 | 10/2016 |
| WO | 0245213 A | 6/2002 |
| WO | WO 02/45213 A2 | 6/2002 |
| WO | 2012121337 A | 9/2012 |
| WO | WO 2012/121337 A1 | 9/2012 |
| WO | 2015148824 A1 | 10/2015 |
| WO | 2016127357 A1 | 8/2016 |
| WO | 2016170333 A1 | 10/2016 |
| WO | 2017021778 A2 | 2/2017 |

OTHER PUBLICATIONS

Douillard et al., "On the Segmentation of 3D LIDAR Point Clouds," (2011), 8 pages.
Hackel et al., "Fast Semantic Segmentation of 3D Point Clouds with Strongly Varying Density," (2016), 8 pages.
Levinson et al., "Automatic Online Calibration of Cameras and Lasers," (2013), 8 pages.
Liu et al., "A 3.9 ps RMS Resolution Time-To-Digital Converter Using Dual-sampling Method on Kintex UltraScale FPGA," (2006), 2 pages.
Montemerlo et al., "Junior: The Stanford Entry in the Urban Challenge," (2008), 31 pages.
Palka et al., "A Novel Method Based Solely on FPGA Units Enabling Measurement of Time and Charge of Analog Signals in Positron Emission Tomography," (2014), 6 pages.
Raismian, "Google Cars Autonomous Driving," (2017), 1 page.
Schwarze, "A New Look at Risley Prisms," (2006), 5 pages.
Tongtong et al., "Gaussian-Process-Based Real-Time Ground Segmentation for Autonomous Land Vehicles," (2014), 25 pages.
Wu et al., "Several Key Issues on Implementing Delay Line Based TDCs using FPGA," (2009), 6 pages.
International Searching Authority, International Search Report and Written Opinion, PCT/US2017/093688, dated Apr. 18, 2018, 10 pages.

(56) References Cited

OTHER PUBLICATIONS

Extended European Search Report dated Mar. 27, 2019 in corresponding European Application No. 17832173.3.
European Patent Office, "Extended European Search Report," 17832173.3, dated Mar. 27, 2019., 9 pages.
European Patent Office, "Partial Supplementary European Search Report," PCT/CN2017/00040, dated Mar. 11, 2019., 12 pages.

* cited by examiner

SYSTEMS AND METHODS FOR OPTICAL DISTANCE MEASUREMENT

CROSS REFERENCE TO RELATED APPLICATION

The present application is a continuation of International Patent Application No. PCT/CN17/93688, filed Jul. 20, 2017, which is incorporated here by reference.

TECHNICAL FIELD

The present disclosure is directed generally to distance measurement, and more specifically to systems and methods for distance measurement using light detection and ranging (LIDAR).

BACKGROUND

Unmanned vehicles such as unmanned aerial vehicles (UAVs) can be used in in many applications, including crop surveillance, photography, inspection of buildings and other structures, fire and safety missions, border patrols, and product delivery, among others. Such unmanned vehicles may be equipped with sensors for detecting obstacles and other objects in the surrounding environment. LIDAR systems can be used to provide distance measurements for three-dimensional obstacle detection and environmental mapping. However, the measurement precision of existing LIDAR systems may not be sufficient for use in complex environments. Accordingly, there is a need for improved techniques for implementing LIDAR systems carried by unmanned vehicles and other movable objects.

SUMMARY

The present disclosure is directed to systems and methods for distance measurement using LIDAR and other optical techniques.

In one aspect, a system for measuring a distance to an object is provided. The system comprises a light emitter configured to emit an outbound light pulse. The system also comprises a light sensor configured to receive a returning light pulse reflected from the object and output an analog pulse signal representing the returning light pulse. The system also comprises an FPGA coupled to the light sensor. The FPGA is configured to convert the analog pulse signal to a plurality of digital signal values, and generate a plurality of time measurements corresponding to the plurality of digital signal values by sampling each digital signal value. The time resolution of the sampling is shorter than a clock period of the FPGA. The system also comprises a controller configured to calculate the distance to the object based on the plurality of digital signal values and the plurality of time measurements.

In another aspect, a method for measuring a distance to an object is provided. The method comprises emitting, by a light emitter, an outbound light pulse. A returning light pulse reflected from the object is received at a light sensor. An analog pulse signal representing the returning light pulse is output by the light sensor. The analog pulse signal is converted to a plurality of digital signal values using an FPGA. The FPGA is used to generate a plurality of time measurements corresponding to the plurality of digital signal values by sampling each digital signal value, with the time resolution of the sampling being shorter than a clock period of the FPGA. The distance to the object is calculated based on the plurality of digital signal values and the plurality of time measurements.

In another aspect, a system for measuring a distance to an object is provided. The system comprises a light emitter configured to emit an outbound light pulse. The system also comprises a light sensor configured to receive a returning light pulse reflected from the object and output an analog pulse signal representing the returning light pulse. The system also comprises an FPGA coupled to the light sensor. The FPGA is configured to convert the analog pulse signal to a plurality of digital signal values by (1) comparing the analog pulse signal to a plurality of threshold values and (2) generating the plurality of digital signal values based on the comparison. The FPGA is also configured to generate a plurality of time measurements corresponding to the plurality of digital signal values. The system also comprises a controller configured to calculate the distance to the object based on the plurality of digital signal values and the plurality of time measurements.

In another aspect, a method for measuring a distance to an object is provided. The method comprises emitting, by a light emitter, an outbound light pulse. A returning light pulse reflected from the object is received at a light sensor. An analog pulse signal representing the returning light pulse is output by the light sensor. The analog pulse signal is converted to a plurality of digital signal values by using an FPGA to (1) compare the analog pulse value to a plurality of threshold values and (2) generate the plurality of digital signal values based on the comparison. The FPGA is also used to generate a plurality of time measurements corresponding to the plurality of digital signal values. The distance to the object is calculated based on the plurality of digital signal values and the plurality of time measurements.

In another aspect, a method for calibrating a distance measurement device is provided. The method comprises providing an FPGA comprising a plurality of differential input ports, where each of the plurality of differential input ports is associated with an offset voltage. The FPGA is configured to receive an analog pulse signal representing a returning light pulse reflected from an object. The FPGA is also configured to convert the analog pulse signal to a plurality of digital signal values by (1) comparing the analog pulse value to a plurality of threshold values using the plurality of differential input ports, and (2) generating the plurality of digital signal values based on the comparison. The FPGA is also configured to generate a plurality of time measurements corresponding to the plurality of digital signal values. The method also comprises calibrating the FPGA to compensate for the offset voltage associated with each of the plurality of differential input ports when converting the analog pulse signal.

The above and other aspects and their implementations are described in greater detail in the drawings, the description and the claims.

DETAILED DESCRIPTION

Figure 1A:
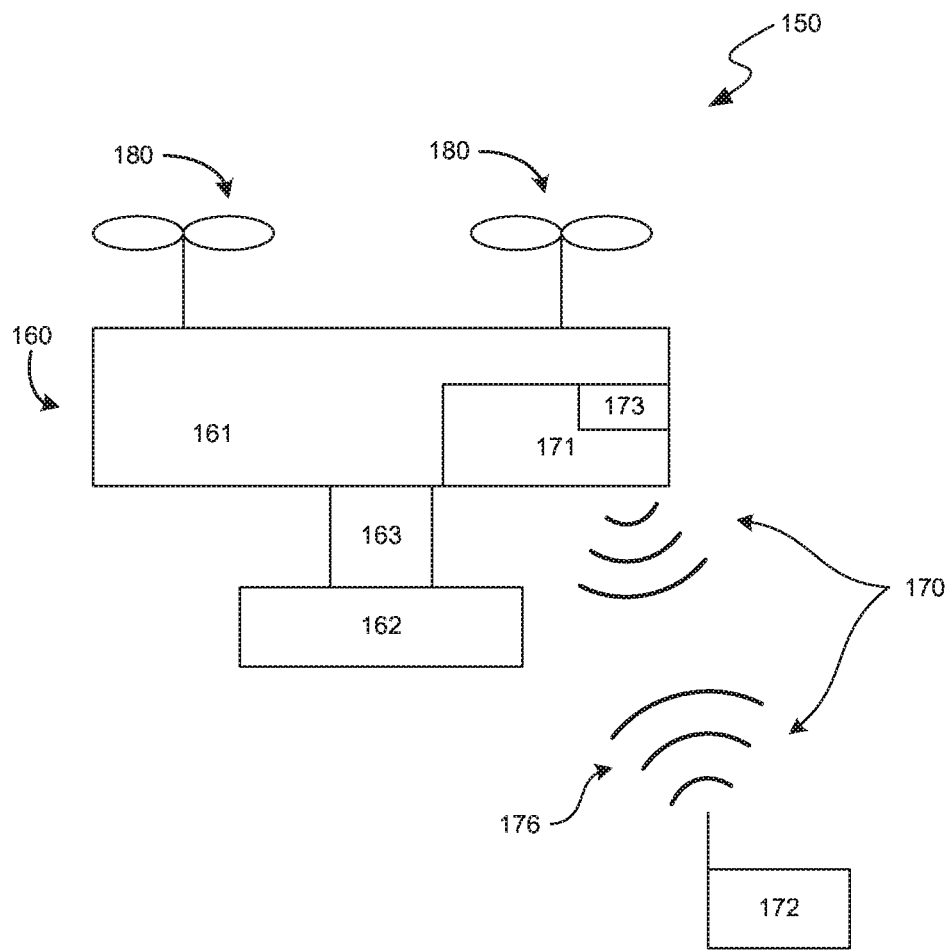
FIG. 1A is a schematic illustration of a representative system including a movable object in accordance with embodiments of the present technology.

The present disclosure relates to systems and methods for measuring the distance to an object using electromagnetic radiation, such as light. In some embodiments, the systems and methods herein provide improved measurement precision (e.g., centimeter-level precision) with reduced cost, power consumption, and processing burden by using an FPGA to process analog pulse signals representing detected light pulses. The FPGA-based approaches of the present technology can be used to accurately digitize an analog pulse signal, and measure timing information for that signal with increased time resolution (e.g., picosecond-level resolution). Additionally, the present technology can be integrated into a wide variety of movable objects, including but not limited to unmanned vehicles, autonomous vehicles, and robots. Accordingly, the embodiments described herein are particularly advantageous for applications which rely on high precision distance measurements in complex and dynamic environments, such as obstacle detection and environmental mapping performed by autonomous or semi-autonomous vehicles.

In the following, numerous specific details are set forth to provide a thorough understanding of the presently disclosed technology. In other embodiments, the techniques introduced here can be practiced without these specific details. In other instances, well-known features, such as specific fabrication techniques, are not described in detail in order to avoid unnecessarily obscuring the present disclosure. References in this description to "an embodiment," "one embodiment," or the like, mean that a particular feature, structure, material, or characteristic being described is included in at least one embodiment of the present disclosure. Thus, the appearances of such phrases in this specification do not necessarily all refer to the same embodiment. On the other hand, such references are not necessarily mutually exclusive either. Furthermore, the particular features, structures, materials, or characteristics can be combined in any suitable manner in one or more embodiments. Also, it is to be understood that the various embodiments shown in the figures are merely illustrative representations and are not necessarily drawn to scale.

In this disclosure, the word "exemplary" is used to mean serving as an example, instance, or illustration. Any embodiment or design described herein as "exemplary" is not necessarily to be construed as preferred or advantageous over other embodiments or designs. Rather, use of the word exemplary is intended to present concepts in a concrete manner.

As used herein A and/or B encompasses one or more of A or B, and combinations thereof such as A and B.

In the following description, although certain embodiments are introduced in connection with a UAV, in other embodiments, the techniques herein are applicable in a similar manner to other types of movable objects including but not limited to other types of unmanned vehicles (e.g., ground vehicles), autonomous vehicles (e.g., self-driving cars) hand-held devices, or robots.

FIG. 1A is a schematic illustration of a representative system 150 having elements in accordance with embodiments of the present technology. The system 150 includes a movable object 160 (e.g., a UAV) and a control system 170. The movable object 160 can be any suitable type of movable object that can be used in various embodiments, such as an unmanned vehicle, an autonomous vehicle, or a robot.

The movable object 160 can include a main body 161 (e.g., an airframe) that can carry a payload 162. Many different types of payloads can be used with the embodiments described herein. In some embodiments, the payload includes one or more sensors, such as an imaging device or an optoelectronic scanning device (e.g., a LIDAR device). For example, the payload 162 can be a camera, a video camera, and/or a still camera. The camera can be sensitive to wavelengths in any of a variety of suitable bands, including visual, ultraviolet, infrared and/or other bands. The payload 162 can also include other types of sensors and/or other types of cargo (e.g., packages or other deliverables).

In some embodiments, the payload 162 is supported relative to the main body 161 with a carrying mechanism 163 (e.g., a gimbal). The carrying mechanism 163 can allow the payload 162 to be independently positioned relative to the main body 161. For instance, the carrying mechanism 163 can permit the payload 162 to rotate around one, two, three, or more axes. The carrying mechanism 163 can also permit the payload 162 to move linearly along one, two, three, or more axes. The axes for the rotational or translational movement may or may not be orthogonal to each other. For example, when the payload 162 includes an imaging device, the imaging device can be moved relative to the main body 161 via the carrying mechanism 163 to photograph, video or track a target.

The movable object 160 can include one or more propulsion units 180 configured to move the movable object 160 with respect to up to three degrees of freedom of translation and/or up to three degrees of freedom of rotation. For example, in embodiments where the movable object 160 is a UAV, the propulsion units 180 can allow the movable object 160 to take off, land, hover, and/or move in the air with respect to up to three degrees of freedom of translation and up to three degrees of freedom of rotation.

Various types of propulsion units are suitable for use with the embodiments herein. In some embodiments, the propulsion units 180 can include one or more rotors. The rotors can include one or more rotor blades coupled to a shaft. The rotor blades and shaft can be rotated by a suitable drive mechanism. For example, the propulsion units 180 can be driven by any suitable motor, such as a DC motor (e.g., brushed or brushless) or an AC motor. The motor can be configured to mount and drive a rotor blade. Although the propulsion units 180 of the movable object 160 are depicted as propeller-based and can have four rotors, any suitable number, type, and/or arrangement of propulsion units can be used. For example, the number of rotors can be one, two, three, four, five, or more. The rotors can be oriented vertically, horizontally, or at any other suitable angle with respect to the movable object 160. The angle of the rotors can be fixed or variable.

The movable object 160 is configured to receive control commands from the control system 170 and/or transmit data to the control system 170. In the embodiment shown in FIG. 1A, the control system 170 includes some components carried on the movable object 160 and some components positioned off the movable object 160. For example, the control system 170 can include a first controller 171 carried by the movable object 110 and a second controller 172 (e.g., a human-operated, remote controller) positioned remote from the movable object 160 and connected via a communication link 176 (e.g., a wireless link such as a radio frequency (RF) based link). The first controller 171 can include a computer-readable medium 173 that executes instructions directing the actions of the movable object 160, including, but not limited to, operation of the propulsion units 180 and the payload 162 (e.g., a camera). The second controller 172 can include one or more input/output devices, e.g., a display and control buttons. In some embodiments, the operator manipulates the second controller 172 to control the movable object 160 remotely, and receives feedback from the movable object 160 via the display and/or other interfaces on the second controller 172. In other embodiments, the movable object 160 can operate autonomously, in which case the second controller 172 can be eliminated, or can be used solely for operator override functions.

In order to ensure safe and efficient operation, it may be beneficial for UAVs and other types of unmanned vehicles to be able to autonomously or semi-autonomously detect obstacles and/or to engage in evasive maneuvers to avoid obstacles. Additionally, sensing of environmental objects can be useful for UAV functions such as navigation, target tracking, and mapping, particularly when the UAV is operating in a semi-autonomous or fully autonomous manner.

Accordingly, the UAVs described herein can include one or more sensors configured to detect objects in the environment surrounding the UAV. In some embodiments, the UAV includes a sensor configured to measure the distance between an object and the UAV, referred to herein as a "distance measurement device." The distance measurement device can be positioned on the UAV in various ways, such as above, underneath, on the side(s) of, or within the main body of the UAV. Optionally, the distance measurement device can be coupled to the UAV via a gimbal or other carrying mechanism that permits the device to be translated and/or rotated relative to the UAV.

In some embodiments, the distance measurement device is a LIDAR device or a laser rangefinder. LIDAR devices and laser rangefinders measure the distance between the device and an object by emitting a light signal (e.g., a laser pulse), detecting the light signal reflected back from the object, and determining the distance to the object based on the speed of light and the time elapsed between transmission and detection. A laser rangefinder provides one-dimensional distance data, while a LIDAR device can provide three-dimensional data of the surrounding environment by emitting the light signal over a plurality of different angles. Although certain exemplary embodiments herein are described in terms of LIDAR devices, this is for illustrative purposes only, and the present technology can also be applied to other types of light-based distance measurement devices, such as laser rangefinders. Additionally, although certain techniques herein are particularly applicable to laser beams produced by laser diodes in a LIDAR system, other types of light sources (e.g., other types of lasers, or light emitting diodes (LEDs)) can be used in other embodiments.

Figure 1B:
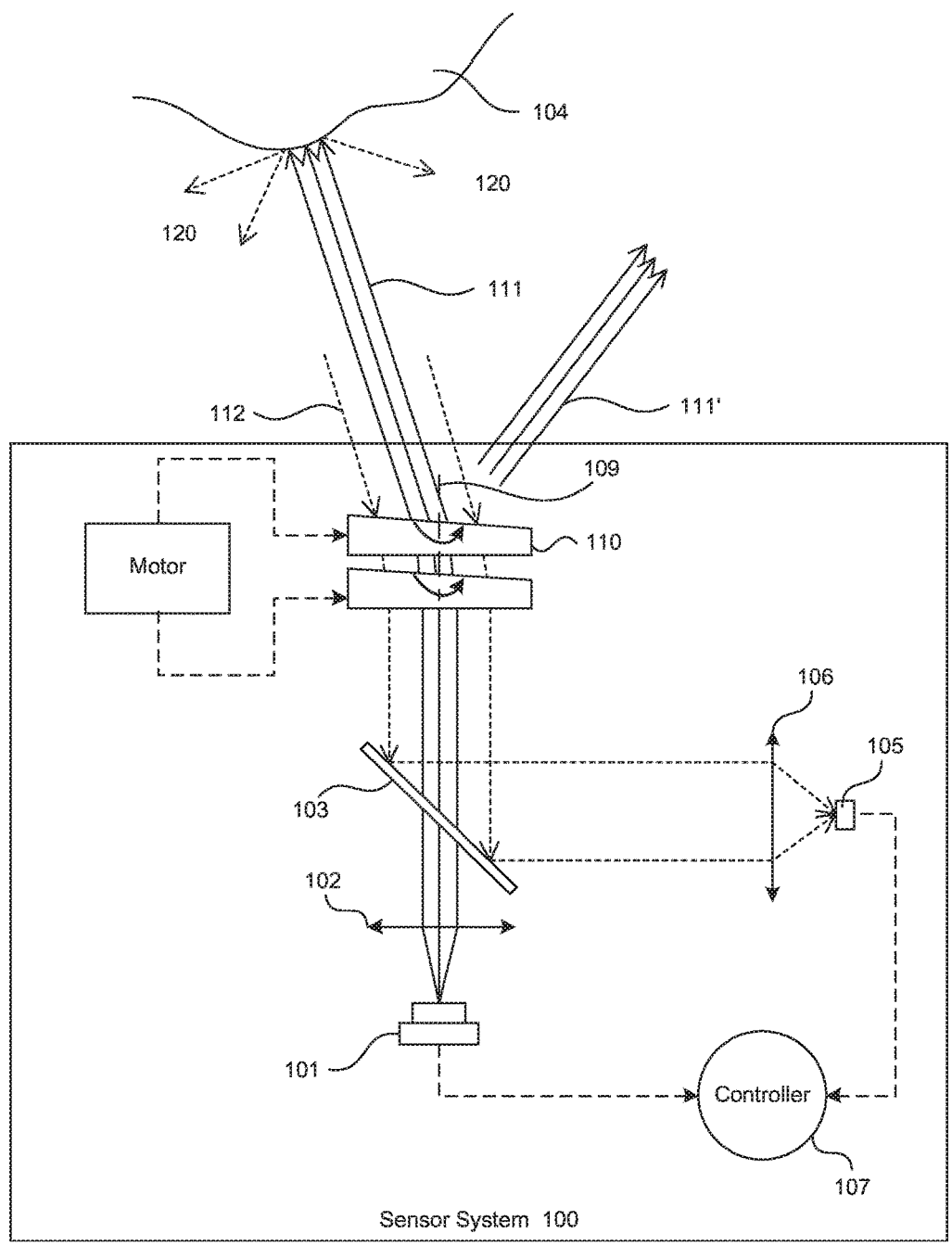
FIG. 1B is a schematic illustration of an exemplary LIDAR system in accordance with embodiments of the present technology.

FIG. 1B is a schematic illustration of an exemplary LIDAR sensor system 100 in accordance with embodiments of the present technology. The LIDAR system 100 detects the distance to the object 104 by measuring the time for light to travel between the LIDAR system 100 and the object 104, i.e., the time-of-flight (TOF). The system 100 includes a light emitter 101 that can generate a light signal, e.g., a laser beam. The laser beam can be a single laser pulse or a series of laser pulses. A lens 102 can be used for collimating the laser beam generated by the light emitter 101. The collimated light can be directed toward a beam splitting device 103. The beam splitting device 103 can allow the collimated light from the light source 101 to pass through. Alternatively, the beam splitting device 103 may not be necessary when different schemes are employed (e.g., when a light emitter is positioned in front of the detector).

The system 100 also includes a beam steering device 110 that can comprise various optical elements such as prisms, mirrors, gratings, optical phase arrays (e.g., liquid crystal-controlled gratings), or a combination thereof. These different optical elements can rotate about a common axis 109 in order to steer the light toward different directions, such as direction 111 and 111'. When the outgoing beam 111 hits the object 104, the reflected or scattered light may spread over a large angle 120 and only a fraction of the energy may be reflected back toward the system 100. The return beam 112 can be reflected by the beam splitting device 103 toward a receiving lens 106, which can collect and focus the returned beam on a detector 105.

The detector 105 receives the returned light and converts the light into electrical signals. A controller including measuring circuitry, such as a TOF unit 107, can be used for measuring the TOF in order to determine the distance to the object 104. Thus, the system 100 can measure the distance to the object 104 based on the time difference between the generating of the light pulse 111 by the light source 101 and the receiving of the return beam 112 by the detector 105.

In order to obtain distance measurements with centimeter-level precision, the light pulses received by the LIDAR devices need to be sampled with a time resolution on the order of hundreds of picoseconds or even sub-hundreds of picoseconds. High resolution sampling is also needed to successfully capture very short pulse signals (e.g., with a pulse duration of only tens of nanoseconds to a few nanoseconds). Many LIDAR systems rely on high-speed analogto-digital converters (ADCs) (e.g., with a sampling rate that exceeds one Giga sample per second (GSPS)) to perform the digitization of light pulse signals. However, high-speed ADCs are typically high cost and require high power consumption. Furthermore, high-speed ADC sampling is based on sampling analog signals with different voltages at the same time interval (i.e., sampling with respect to the time axis). As such, the timing of the sampling is independent from the pulse signal and without any time correlation. An extraction algorithm is needed to extract the timing information of the analog signal.

The present technology provides methods of achieving high precision distance measurements that do not rely on the use of high-speed ADCs. In some embodiments, the systems and devices herein are configured to digitize an analog pulse signal using comparator-based sampling. A single comparator can be used to determine the timing when the analog pulse signal crosses a certain threshold (also referred to herein as a "reference threshold" or a "triggering threshold"), while multiple comparators can be used to determine the timing for multiple thresholds.

Figure 2A:
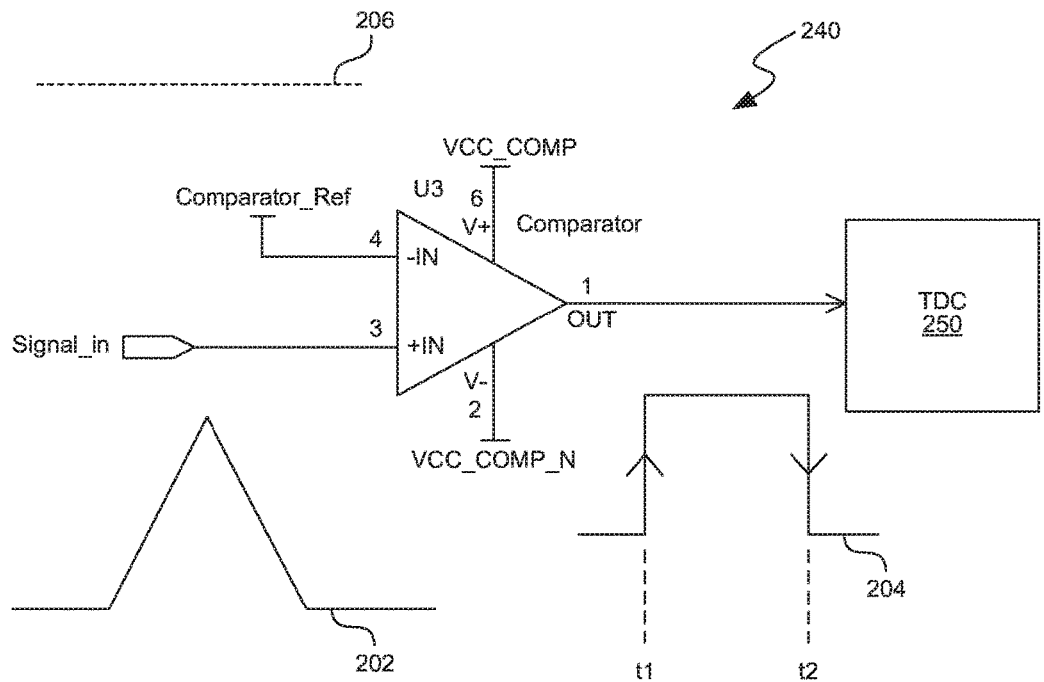
FIG. 2A is a schematic illustration of a comparator-based sampling configuration in accordance with embodiments of the present technology.

FIG. 2A is a schematic illustration of a comparator-based sampling configuration in accordance with embodiments of the present technology. The comparator 240 can be an operational amplifier that is configured to compare the voltage between its non-inverting input (PIN3) against its inverting input (PIN4), and to output a logic high or low voltage based on the comparison. For example, when an analog pulse signal 202 (e.g., representing a light pulse that is reflected back from a target object) is received at the non-inverting input PIN3, the comparator 240 compares the voltage level of the signal 202 against a reference threshold 206 at the inverting input PIN4. The signal 202 has two sections: a leading section in which the magnitude increases, and a trailing section in which the magnitude decreases. When the magnitude in the leading section of signal 202 exceeds the reference threshold 206, the output of the comparator 202 becomes high (e.g., VDD). Similarly, when the magnitude in the trailing section of signal drops below the reference threshold 206, the output of the comparator 202 becomes low (e.g., GND). The result is a digitized (e.g., binary) square pulse signal 204.

Figure 2B:
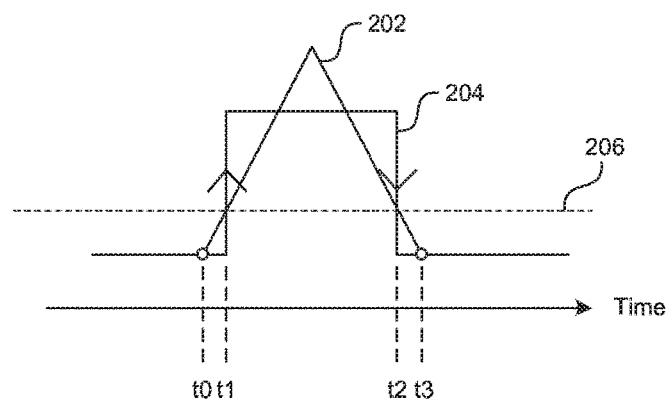
FIG. 2B illustrates the input and output waveforms of the comparator of FIG. 2A in accordance with embodiments of the present technology.

FIG. 2B is an illustration of the input and output waveforms of the comparator 240 of FIG. 2A. When the square pulse signal 204 is output to a time-to-digital converter (TDC) 250, relevant timing information of the signal 204 (e.g., time t1 and time t2) can be extracted. Because there is a correlation between the sampling points and time (in contrast to the ADC-based method), the high-speed comparator method can effectively capture pulse timing information in a more direct manner.

Figure 3:
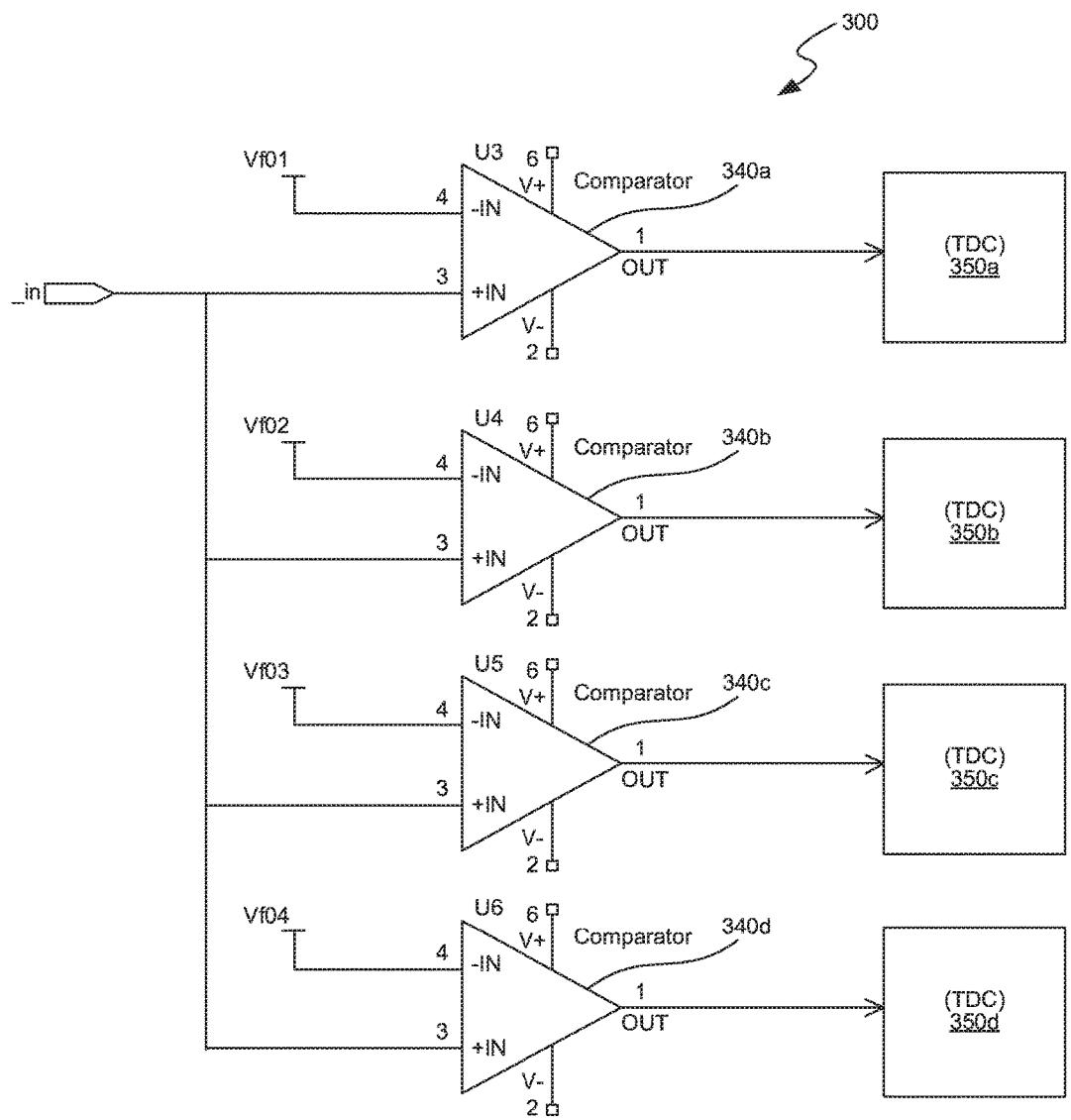
FIG. 3 is a schematic illustration of a multi-comparator sampling configuration in accordance with embodiments of the present technology.

FIG. 3 is a schematic illustration of a multi-comparator sampling configuration 300 in accordance with embodiments of the present technology. The multi-comparator configuration 300 includes two or more comparators (e.g., comparators 340a-340d). Each of the comparators is coupled to the same input to perform timing measurement on the same light pulse, but each of the comparators has a different triggering threshold. In this example, the comparator configuration 300 includes a total of four comparators, 340a-340d. Each comparator is connected to its respective individual time-to-digital converter (TDC), 350a-350d. Additionally, each comparator receives a different triggering threshold. As illustrated, comparator 340a receives its individual triggering threshold Vf01, comparator 340b receives Vf02, comparator 340c receives Vf03, and comparator 340d receives Vf04. Thus, timing information can be obtained at four different threshold levels, e.g., Vf01-Vf04.

In some embodiments, the systems and devices described herein are configured to provide high precision distance measurements using a field-programmable device, such as an FPGA or a complex programmable logic device (CPLD). Although certain exemplary embodiments herein are described with reference to FPGAs, the present technology can also be implemented using other types of field-programmable devices such as CPLDs.

An FPGA is an integrated circuit including a plurality of logic blocks that can be programmed by a user after the manufacturing of the FPGA to provide a wide variety of different functionalities. In some embodiments, an FPGA includes an array of programmable logic blocks (e.g., configurable logic blocks (CLBs) or logic array blocks (LABs)) and input/output (I/O) blocks. The logic blocks and I/O blocks can be coupled to each other via programmable routing. Each logic block can include a plurality of logic cells or slices. A logic cell or slice can include a plurality of components that can be configured by the user to implement logic functions, including but not limited to one or more LUTs (e.g., 3-input or 4-input LUTs), flip-flops, multiplexers, and/or carry logic. For example, the present technology can utilize a FPGA manufactured by Altera Corporation (San Jose, Calif.), such as the EP4CE22U256 or EP4CE30F324, or by Xilinx, Inc. (San Jose, Calif.), such as the XC7Z030-1SBG485C or XC7Z007S-1CLG400C.

For example, an FPGA can be configured to perform some of the operations involved in optical distance measurement, such as digitizing an analog pulse signal into a plurality of digital signal values (pulse digitization), determining a plurality of time measurements corresponding to the plurality of digital signal values (time-to-digital conversion), and calculating the object distance using the digital signal values and time measurements. The FPGA-based systems and methods described herein can be used to provide centimeter-level precision in distance measurements with relatively low cost and power consumption.

Figure 4:
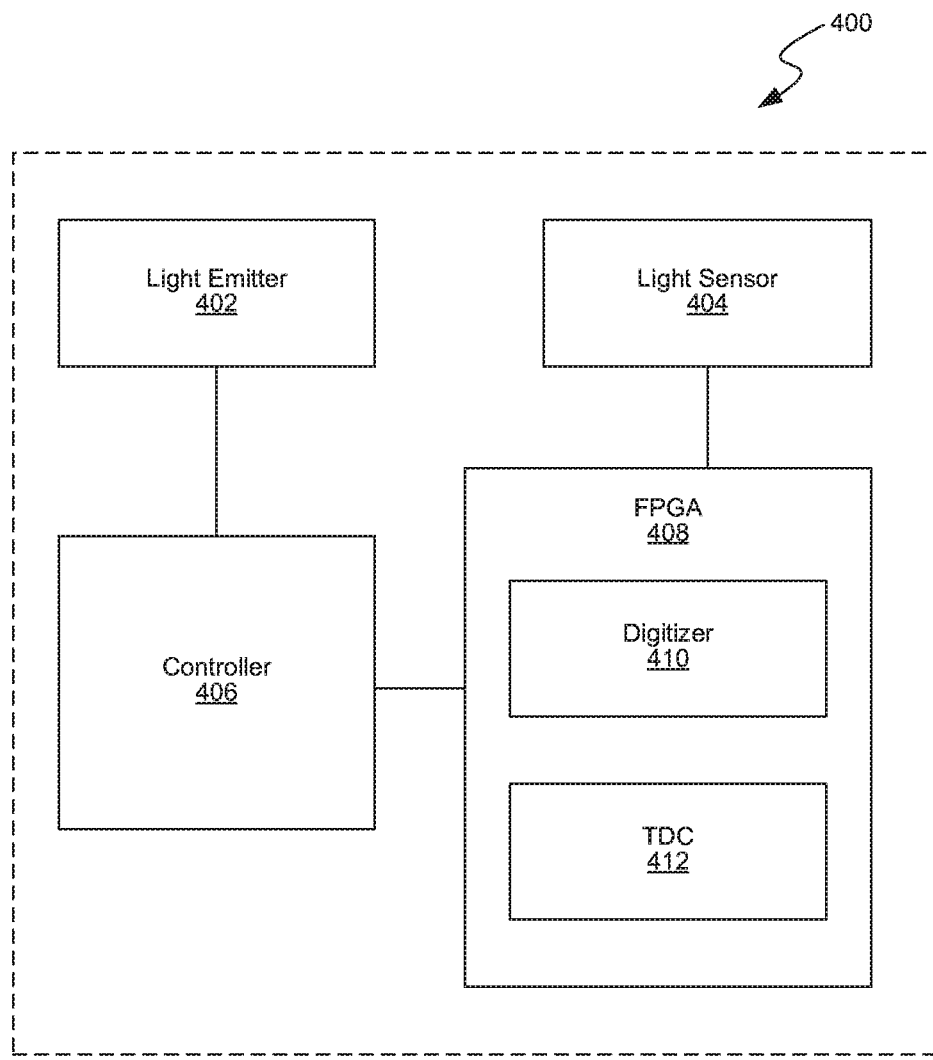
FIG. 4 is a schematic illustration of a system for measuring distance using an FPGA in accordance with embodiments of the present technology.

FIG. 4 is a schematic illustration of a system 400 for measuring distance using an FPGA in accordance with embodiments of the present technology. The system 400 includes a light emitter 402 configured to emit an outbound light pulse (e.g., a laser pulse), similar to the light emitter 101 of FIG. 1B. The system 400 also includes a light sensor 404 configured to receive a returning light pulse reflected from an object (e.g., an object in the environment surrounding the system 400), similar to the light detector 105 of FIG. 1B. The light sensor 404 is configured to output an analog pulse signal representing the returning light pulse, e.g., using a photodetector that converts optical energy into an electrical signal.

The system 400 includes an FPGA 408. The FPGA 408 is coupled to the light sensor 404 and configured to receive the analog pulse signal generated by the light sensor 404. The FPGA 408 can be configured to process the analog pulse signal in order to convert it into a digital signal and extract timing information. In some embodiments, the FPGA 408 includes a digitizer 410 configured to digitize the analog pulse signal into a plurality of digital signal values and a TDC 412 configured to determine a plurality of time measurements corresponding to the plurality of digital signal values. Each digital signal value can represent a voltage level of the analog pulse signal, and the corresponding time measurement can represent a time point when the analog pulse signal is at that voltage level. The digitizer 410 and the TDC 412 can be implemented using various types of FPGA components. Exemplary configurations of the digitizer 410 and the TDC 412 are described in further detail herein.

The system 400 can include a controller 406. In some embodiments, the controller 406 is coupled to the light emitter 402, e.g., to control the emission of the outbound light pulse and record a time measurement at which the outbound light pulse is emitted. The controller 406 can also be coupled to the FPGA 408 in order to receive the digital signal values and time measurements generated by the FPGA 408, and calculate the distance to the object based on the digital signal values and time measurements. For example, the controller 406 can be configured to calculate the object distance by inputting the digital signal values and time measurements into a function and deriving an estimated time value for the returning light pulse using the function. The estimated time value can then be used in a TOF calculation to determine the distance to the object.

The controller 406 can use many different types of functions to calculate the estimated time value. In some embodiments, the function is a pulse signal model, such as a polynomial or a triangular model. The controller 406 can fit the digital signal values and time measurements to the pulse signal model and derive an estimated time value based on the shape of the model. For example, the controller 406 can determine the estimated time value based on when the signal magnitude reaches its maximum. In some embodiments, the controller 406 can use other criteria, such as the width of the signal in a square signal model, to derive the estimated time value associated with the pulse signal.

In some embodiments, the controller 406 uses a search function to derive the estimated time value. The controller 406 can search in a database or a look-up table (LUT) to find a set of values that is the closest match to the digital signal values and time measurements. The set of values may have the form of $(t_i, Vf_i)$, where $Vf_i$ is a voltage level and $t_i$ is a time measurement corresponding to that voltage level. The set of values can map to an output time value or an output tuple in the form of (T, V), that is stored in the database or look-up table. V may correspond to one of the threshold values used to digitize the analog pulse signal, as described further herein. In some embodiments, V may be a predetermined signal magnitude different from the threshold values. The controller then can select the mapped output time value, or T from the mapped output tuple corresponding to V, to facilitate the computation of the TOF in order to determine the distance of the corresponding object from the system.

Some or all of the components of the system 400 can be carried by a movable object, such as an unmanned vehicle (e.g., a UAV), an autonomous vehicle (e.g., a self-driving car) or a robot. Thus, the system 400 can be used to measure the distances between the movable object and surrounding objects as the movable object operates within an environment. In some embodiments, the system 400 is particularly suitable for use in complex and dynamic environments, e.g., environments having many objects surrounding the system 400, environments in which obstacles are moving rapidly relative to the system 400, environments with fluctuating conditions such as temperature, and so on. The system 400 is also particularly suitable for use in conjunction with movable objects that are capable of rapid movement with respect to multiple degrees of freedom.

Although FIG. 4 illustrates an exemplary embodiment of a system for measuring distance using an FPGA, alternative configurations of the system 400 can also be used. For example, although FIG. 4 illustrates a single digitizer 410 and a single TDC 412, the FPGA 408 can also include multiple digitizers and/or multiple TDCs. Various combinations of digitizers and TDCs can be used, e.g., each digitizer can be coupled to a respective TDC, a single digitizer can be coupled to multiple TDCs, or a single TDC can be coupled to multiple digitizers.

As another example, in some embodiments, either the digitizer 410 or the TDC 412 may be optional, such that the pulse digitization step or time-to-digital conversion step is performed by a device other than the FPGA 408. For instance, the pulse digitization can be performed by one or more comparators (e.g., as depicted in FIG. 2A or FIG. 3), while the time-to-digital conversion is performed by the TDC 412 of the FPGA 408. Alternatively, pulse digitization can be performed by the digitizer 410 of the FPGA 408, while a device other than the FPGA 408 (e.g., a separate TDC) performs the time-to-digital conversion.

In yet another example, although the controller 406 is depicted in FIG. 4 as a separate device from the FPGA 408, in other embodiments, the controller 406 can be part of the FPGA 408. In such embodiments, the FPGA 408 is configured to perform some or all of the functions of the controller 406. For example, the FPGA 408 can be configured to perform the distance calculation using the digital signal values generated by the digitizer 410 and the time measurements generated by the TDC 412.

As discussed above, the systems and devices described herein can include an FPGA having one or more digitizers (e.g., digitizer 410 of FPGA 408) configured to convert an analog pulse signal into a plurality of digital signal values. A digitizer can be implemented using an FPGA in various ways. For example, the digitizer can be implemented using one or more differential input ports of the FPGA. Any suitable type of differential input port can be used, such as a low-voltage differential signaling (LVDS) interface or an emitter-coupled logic (ECL) interface. The differential input port can be configured to compare a first voltage and a second voltage, and output a different digital signal value based on the comparison, e.g., whether the first voltage is greater than, less than, or equal to the second voltage.

Figure 5A:
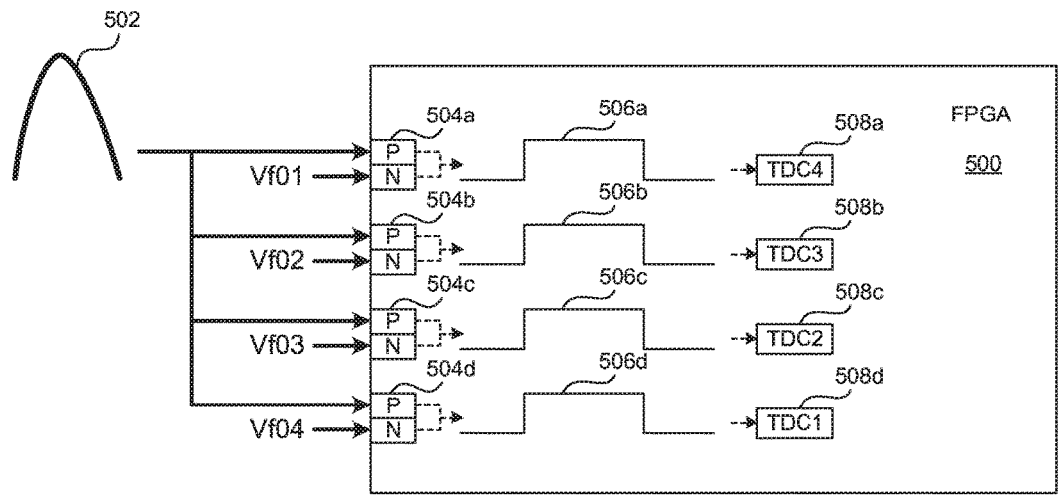
FIG. 5A is a schematic illustration of an FPGA configured for pulse digitization in accordance with embodiments of the present technology.

FIG. 5A is a schematic illustration of an FPGA 500 configured for pulse digitization in accordance with embodiments of the present technology. The FPGA 500 Is configured to receive an analog pulse signal 502 via a plurality of differential input ports 504a-504d. Each differential input port includes a first pin (P) and a second pin (N). The first pin of each differential input port can be configured to receive the analog pulse signal 502. The second pin of each differential input port can be configured to receive a threshold value. For instance, in the depicted embodiment, differential input port 504a receives threshold value Vf01, differential input port 504b receives threshold value Vf02, differential input port 504c receives threshold value Vf03, and differential input port 504d receives threshold value Vf04. The threshold values Vf01-Vf04 can be different voltages, such that each differential input port receives a different threshold value.

Each differential input port can be configured to compare the received threshold value with the analog pulse signal and generate a digital signal value based on the comparison. The digital signal value can indicate whether the analog pulse signal is greater than or less than the threshold value at a particular time point. For instance, the differential input port can output a "1" if the voltage received at the first pin (e.g., the analog pulse signal) is higher than the voltage of the second pin (e.g., the threshold value), and output a "0" if the voltage of the first pin is lower than the voltage of the second pin. Thus, the digital signal values generated by the differential input ports 504a-504d can be collectively used to determine the voltage level of the analog pulse signal 502 at a particular time point. For example, an output of "1000" across ports 504a-504d can correspond to the signal 502 being at voltage Vf01, an output of "1100" can correspond to the signal 502 being at Vf02, an output of "1110" can correspond to the signal 502 being at Vf03, and an output of "1111" can correspond to the signal 502 being at Vf04.

Because the voltage level of the analog pulse signal 502 varies over time, the digital signal values produced by the differential input ports 504a-504d will also vary with time, as represented by square wave signals 506a-506d. A change from "0" to "1" in the digital signal value, corresponding to a rising edge of the square wave signal, indicates that the analog pulse signal 502 has transitioned above the threshold value for that differential input port. A change from "1" to "0" in the digital signal value, corresponding to a falling edge of the square wave signal, indicates that the signal 502 has transitioned below the threshold value. Thus, the voltage levels of the analog pulse signal 502 can be determined by detecting the edges of the square wave signals 506a-506d output by the differential input ports 504a-504d.

The digital signal values and/or square wave signals 506a-506d generated by the differential input ports 504a-504d can be received by a plurality of TDCs 508a-508d in order to determine corresponding time measurements, as discussed in further detail herein. Thus, the FPGA 500 can determine the time points at which the analog pulse signal 502 reaches, exceeds or falls below each threshold value, and thereby generate a set of data samples providing a digitized representation of the analog pulse signal.

Figure 5B:
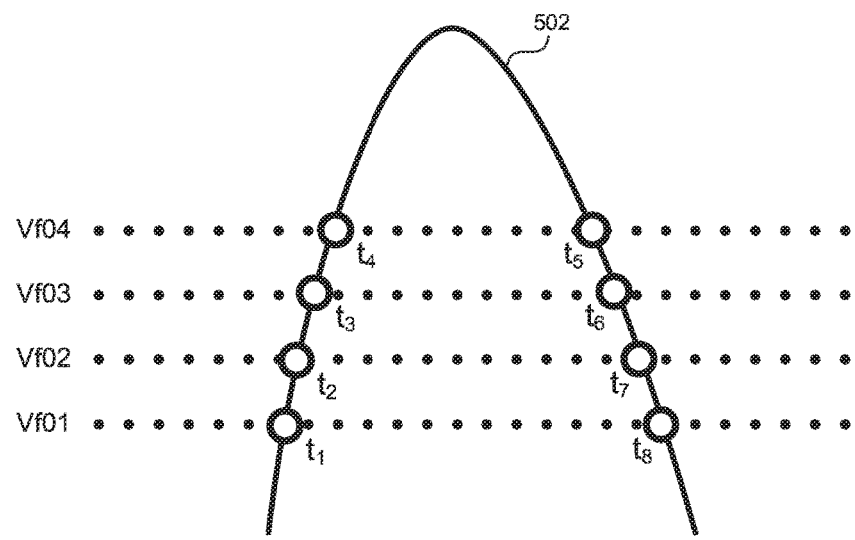
FIG. 5B illustrates digitization of an analog pulse signal using the FPGA of FIG. 5A in accordance with embodiments of the present technology.

FIG. 5B illustrates digitization of an analog pulse signal 502 in accordance with embodiments of the present technology. In this example, the analog pulse signal 502 is compared to four different threshold values, Vf01-Vf04, using the differential input ports 504a-504d of the FPGA 500, and the TDCs 508a-508d are used to generate time measurements t1-t8 corresponding to when the analog pulse signal 502 first exceeds or falls below each threshold value. Thus, the analog pulse signal 502 can be digitized into a set of 8 data samples: (t1, Vf01), (t2, Vf02), (t3, Vf03), (t4, Vf04), (t5, Vf04), (t6, Vf03), (t7, Vf02), and (t8, Vf01).

Although FIGS. 5A and 5B illustrate pulse digitization using four differential input ports and four threshold values, other numbers of differential input ports and threshold values can also be used. For instance, in some embodiments, pulse digitization can be performed using a single differential input port and a single threshold value, at least 2 differential input ports and at least 2 threshold values, at least 4 differential input ports and at least 4 threshold values, at least 8 differential input ports and at least 8 threshold values, or at least 12 differential input ports and at least 12 threshold values. The number of differential input ports and number of threshold values can be varied depending on the degree of sampling accuracy desired.

In some embodiments, some or all of the differential input ports may have an offset voltage between the first and second pins, which may affect the accuracy of pulse digitization. An offset voltage can refer to the voltage differential between the first and second pins that produces a change in the output signal of the differential input port. It may be beneficial to calibrate the FPGA to compensate for these offset voltages in order to improve measurement accuracy.

In some embodiments, the calibration procedure involves measuring the offset voltage of each differential input port. Any method suitable for measuring the offset voltage of a differential input port can be used. For example, the offset voltage can be measured by applying a variable voltage signal (e.g., an increasing or decreasing voltage signal) to the first pin and applying a fixed voltage signal to the second pin. The voltage applied to the first pin can be varied until a change is detected in the output signal of the differential input port, thus indicating that the voltage applied to the first pin has exceeded or fallen below the fixed voltage applied to the second pin. At that point in time, the voltage difference between the first and second pins can be determined (e.g., by direct measurement) and used as the offset voltage of the differential input port.

As another example, the offset voltage can be measured by applying a variable voltage signal having a known waveform (e.g., a triangular or trapezoidal wave signal) to the first pin and applying a fixed voltage signal to the second pin. The voltage applied to the first pin can be varied until a change is detected in the output signal of the differential input port, thus indicating that the voltage applied to the first pin has exceeded or fallen below the fixed voltage applied to the second pin. During this process, a time point at which the change in the output signal of the differential input port is detected can be determined. The voltage difference between the first and second pins, which corresponds to the offset voltage of the differential input port, can be calculated based on the time point and the known waveform of the variable voltage signal.

Figure 6:
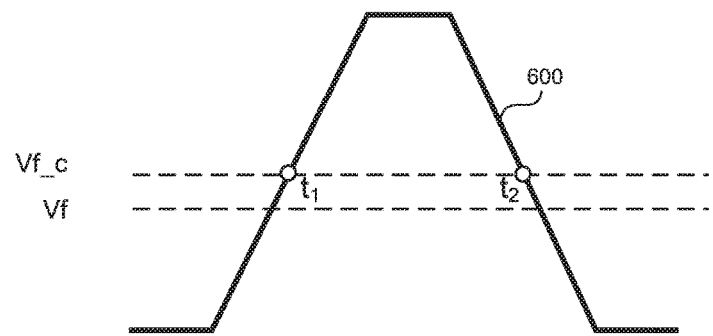
FIG. 6 illustrates a trapezoidal wave signal for performing offset calibration in accordance with embodiments of the present technology.

FIG. 6 illustrates a trapezoidal wave signal 600 for performing offset calibration in accordance with embodiments of the present technology. The waveform of the signal 600 (e.g., the slope of the leading and trailing sections) is known and can be used to determine the offset voltage of a differential input port. For example, the trapezoidal wave signal 600 can be applied to the first pin of a differential input port, and a fixed voltage signal having a voltage of Vf can be applied to the second pin of the differential input port. Voltage Vf_c represents the voltage applied to the first pin at the time when the output of the differential input port changes. Thus, the difference between voltages Vf_c and Vf represents the offset voltage of the differential input port.

The difference between voltages Vf_c and Vf can be determined in various ways. For example, this difference can be determined by applying the signal 600 to the differential input port, and measuring the time $t_1$ at which the output of the port changes (e.g., from "0" to "1"), and/or measuring the time $t_2$ at which the output of the port changes (e.g., from "1" to "0"). The time interval between $t_1$ and $t_2$ can be determined based on the known waveform of the signal 600. The voltage Vf_c can be determined based on $t_1$, $t_2$, and the waveform of the signal 600. Since the voltage Vf is also already known, the offset voltage can be determined by calculating the difference between Vf_c and Vf.

Once the offset voltages of the differential input ports have been measured, the FPGA can be calibrated to compensate for the offset voltages. Many different methods can be used to calibrate the FPGA based on the measured offset voltages. For example, the FPGA can be calibrated by applying an adjustment voltage to the differential input port (e.g., the first or second pin of the differential input port) that is configured to compensate for the measured offset voltage. The magnitude of the adjustment voltage can be equal or approximately equal to the magnitude of the measured offset voltage. The adjustment voltage can be applied by an adjustable voltage source, such as a digital-to-analog converter (DAC).

As another example, the measured offset voltages can be used as input parameters for the function used to calculate the estimated time value of the returning light pulse. As previously discussed, the FPGA and/or a separate controller can use a function to calculate an estimated time value for the returning light pulse based on the digital signal values and time measurements generated by the digitizer and TDC, respectively. The measured offset voltages can serve as additional inputs into the function. A function relating the estimated time value to the digital signal values, time measurements, and measured offset voltages can be derived using any suitable technique. For example, because the offset voltages are independent of the measurement distance, the function can be derived by performing multiple distance measurements over multiple known distances, and determining a model relating the distances and/or the expected TOF corresponding to those distances to the input parameters of the function (e.g., digital signal values, time measurements, and measured offset voltages).

Alternatively, the FPGA can be calibrated to compensate for the offset voltages of the differential input ports without measuring the offset voltages. In such embodiments, the offset voltages can collectively be represented as one or more offset adjustment parameters, and the estimated time value can be determined using a function that relates the estimated time value to the digital signal values, time measurements, and the offset adjustment parameter(s). Since the one or more offset adjustment parameters are independent of the measurement distance, the function can be derived by performing multiple distance measurements over multiple known distances, and determining a model relating the distances and/or the expected TOF corresponding to those distances to the input parameters of the function (e.g., digital signal values, time measurements, and offset adjustment parameter(s)).

In some embodiments, a differential input port of an FPGA may exhibit a delay time between receiving the analog pulse signal and outputting the corresponding digital signal value, such that the timing of the digital signal value is delayed relative to the timing of the analog pulse signal. In order to improve measurement accuracy, it may be beneficial to calibrate the FPGA to compensate for these port delays. In some embodiments, the FPGA is calibrated by measuring the delay time associated with each differential input port, and compensating for these measured delay times when calculating the estimated time value for the returning light pulse, e.g., by subtracting the delay times from the time measurements generated by the FPGA.

Figure 7:
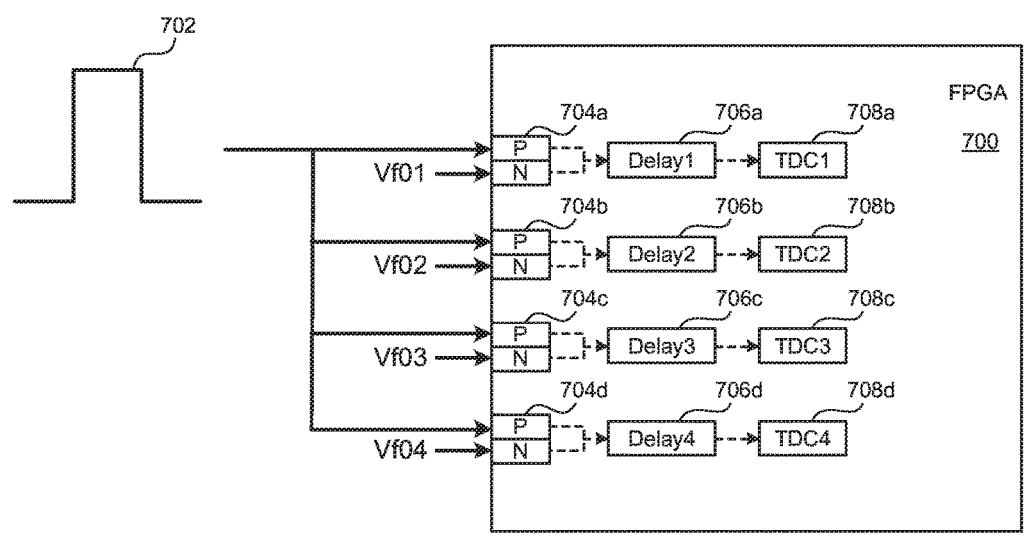
FIG. 7 is a schematic illustration of a method for measuring port delays in accordance with embodiments of the present technology.

FIG. 7 is a schematic illustration of a method for measuring port delays in accordance with embodiments of the present technology. The FPGA 700 includes a plurality of differential input ports 704a-704d and a plurality of TDCs 708a-708d, which may be similar to the differential input ports 504a-504d and TDCs 508a-508d, respectively, of FIG. 5A. Each differential input port compares a square wave signal 702 having a known timing to one of the threshold values Vf01-Vf04. In some embodiments, the timing of the square wave signal 702 differs from the timing of the digital signal values output by the differential input ports 704a-704d due to delay times exhibited by the differential input ports 704a-704d, schematically represented herein by port delays 706a-706d. The magnitude of the delay times can be determined by comparing the known timing of the square wave signal 702 to the time measurements generated by the TDCs 708a-708d.

As discussed above, the systems and devices described herein can include an FPGA having one or more TDCs (e.g., TDC 412 of FPGA 408) configured to generate time measurements. A TDC can be implemented using an FPGA in various ways. For example, the TDC can be implemented by configuring the FPGA to receive a plurality of digital signal values representing a digitized analog pulse signal (e.g., generated by the digitizer 410), and sampling each digital signal value to generate a corresponding time measurement. In some embodiments, the FPGA receives and samples a square wave signal representing changes in the value of a digital signal value over time to determine time measurements for the rising and falling edges of the signal. The time measurements for the rising and falling edges of the square wave signal can represent the time points at which the analog pulse signal reaches, exceeds, or falls below a particular threshold value, as previously discussed.

In some embodiments, the sampling is performed with a high time resolution, e.g., a time resolution on the order of hundreds of picoseconds or sub-hundreds of picoseconds. For example, the time resolution of the sampling can be in a range from about 5 picoseconds to about 2000 picoseconds, from about 10 picoseconds to about 1000 picoseconds, from about 1 picosecond to about 500 picoseconds, or from about 1 picosecond to about 100 picoseconds. In some embodiments, the time resolution of the sampling (e.g., on a picosecond level) is shorter than the clock period of the FPGA clock (e.g., on a nanosecond level). For instance, the time resolution can be at least 2 times, 5 times, 10 times, 20 times, or 100 times shorter than the clock period of the FPGA.

High time resolution sampling of a digital signal can be implemented using an FPGA in various ways. In some embodiments, the FPGA is configured to perform high time resolution sampling using a plurality of delay units. The delay units can be sequentially coupled to each other such that the digital signal value is sequentially propagated through the delay units, with each successive delay unit receiving a time-delayed version of the digital signal value from the preceding delay unit. Thus, the time measurement for the digital signal value can be determined by counting the number of delay units that have received the digital signal value in a known time interval.

Figure 8A:
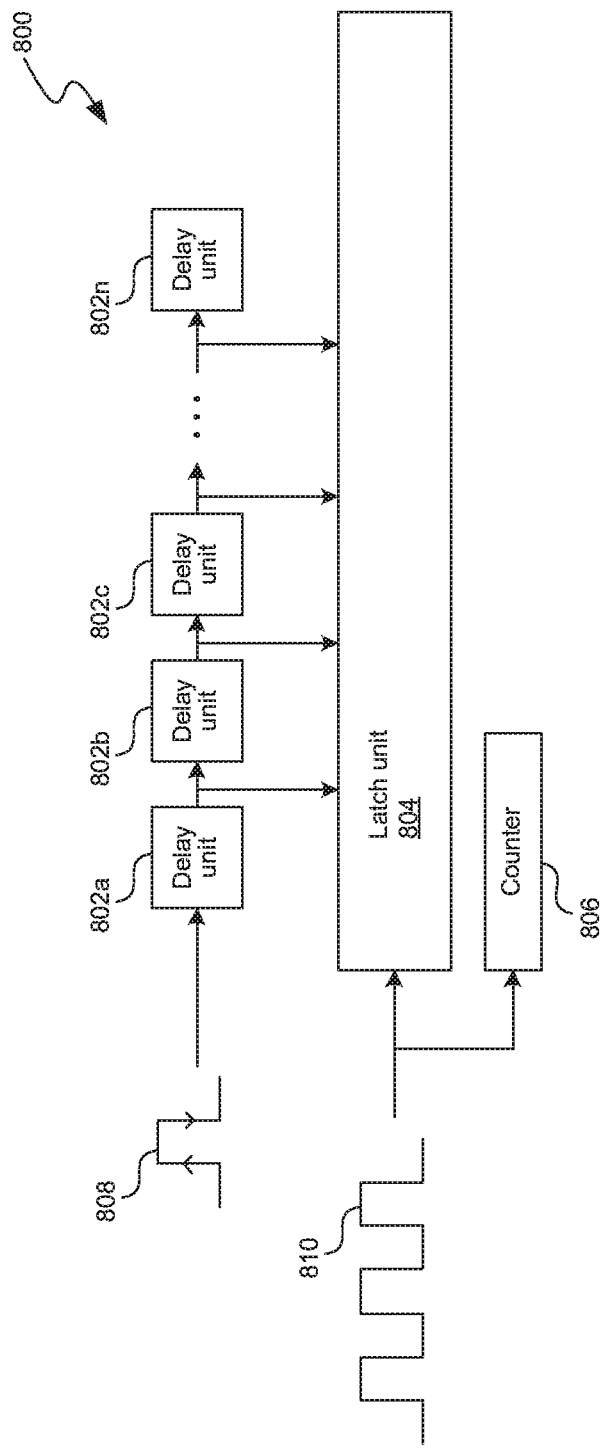
FIG. 8A is a schematic illustration of an FPGA configured for time-to-digital conversion with a high time resolution in accordance with embodiments of the present technology.

FIG. 8A is a schematic illustration of an FPGA 800 configured for time-to-digital conversion with a high time resolution in accordance with embodiments of the present technology. The FPGA 800 includes a plurality of delay units 802a-802n sequentially coupled to each other. Any suitable number of delay units can be used, such as at least 10, at least 25, at least 50, at least 100, or at least 200 delay units. Each delay unit can produce a picosecond-level delay in signal transmission, $t_d$. For example, each delay unit can be configured to produce a delay within a range from about 5 picoseconds to about 2000 picoseconds, from about 10 picoseconds to about 1000 picoseconds, from about 1 picosecond to about 500 picoseconds, or from about 1 picosecond to about 100 picoseconds. In some embodiments, the delay produced by each delay unit is the same. In other embodiments, some or all of the delay units produce different delay times, such that $t_d$ represents the average delay time across all units. The delay units 802a-802n can be configured in various ways using the logic components within the FPGA. For example, the plurality of delay units 802a-802n can include a carry chain or an LUT.

The delay units 802a-802n can be configured to receive a digital signal value corresponding to a digitization of an analog pulse signal. The digital signal value may be received as a square wave signal 808 representing changes in the digital signal value over time. The signal 808 can be sequentially transmitted through each of the delay units 802a-802n, such that the signal received by each successive delay unit is delayed from the signal received by the preceding delay unit by the delay time $t_d$. Each delay unit can be configured to produce an output signal when it receives an edge of the signal 808. For example, the delay unit can output a "1" when triggered by a rising edge of the signal 808, and can output a "0" when triggered by a falling edge of the signal 808.

The delay units 802a-802n are coupled to a latch unit 804. The latch unit 804 can be configured to latch the outputs of the delay units 802a-802n when the delay units 802a-802n are triggered by the signal 808. In some embodiments, the latch unit 804 includes a plurality of latches, each of which is coupled to a corresponding delay unit and is configured to latch the output of that delay unit when it is triggered by a rising or falling edge of the signal 808.

The FPGA 800 also includes a clock configured to produce a clock signal 810. The clock signal 810 can have a rate on the order of hundreds of MHz to GHz, such that the signal 810 has a nanosecond-level clock period, $T_{ck}$. The clock signal 810 can be received by the latch unit 804 and a counter 806. The counter 806 can count the number of clock cycles since the start of the measurement, $C_r$, such that the coarse time measurement provided by the FPGA clock is $C_r T_{ck}$.

Each clock period, the FPGA 800 can determine the number of delay units triggered by the signal 808 to provide a high resolution time measurement corresponding to the rising or falling edge of the signal 808. The details of the time measurement method are discussed with respect to FIGS. 8B and 8C below.

Figure 8B:
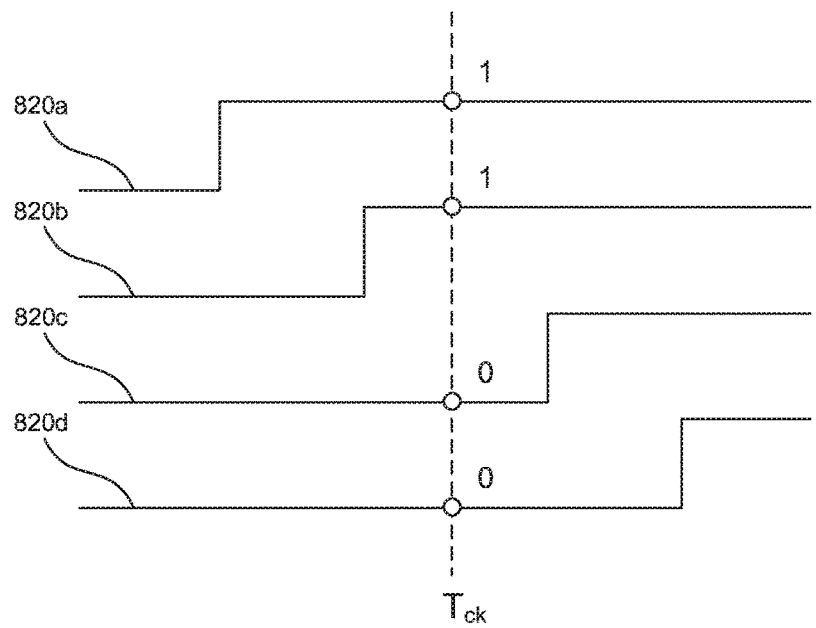
FIG. 8B illustrates time-to-digital conversion of a rising edge signal in accordance with embodiments of the present technology.

FIG. 8B illustrates time-to-digital conversion of a rising edge signal in accordance with embodiments of the present technology. In the depicted embodiment, the rising edge signal is transmitted through a sequence of four delay units, such that the first delay unit receives signal 820a, the second delay unit receives signal 820b, the third delay unit receives signal 820c, and the fourth delay unit receives 820d. Each successive signal is delayed from the preceding signal by a delay time $t_d$. At time $T_{ck}$, the latched output of each delay unit is sampled. In the depicted embodiment, the first and second delay units have already been triggered by the rising edge of signals 820a and 820b, respectively, such that the outputs of these delay units are both "1." The third and fourth delay units have not yet been triggered by the rising edge of signals 820c and 820d, respectively, such that the outputs of these delay units are both "0." Thus, the sequence latched by the latch unit 804 at time $T_{ck}$ is "1100." The time measurement of the rising edge signal, $T_{rising}$, can be calculated based on the number of delay units that are latched at "1," $C_{r1}$, using the relation $T_{rising}=C_r T_{ck} C_{r1} t_d$.

Figure 8C:
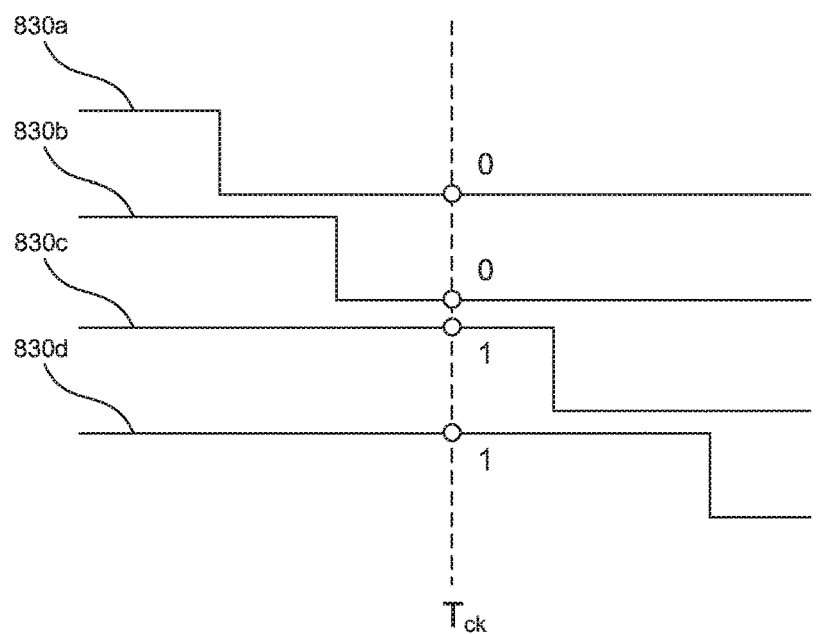
FIG. 8C illustrates time-to-digital conversion of a falling edge signal in accordance with embodiments of the present technology.

FIG. 8C illustrates time-to-digital conversion of a falling edge signal in accordance with embodiments of the present technology. In the depicted embodiment, the rising edge signal is transmitted through a sequence of four delay units, such that the first delay unit receives signal 830a, the second delay unit receives signal 830b, the third delay unit receives signal 830c, and the fourth delay unit receives 830d. Each successive signal is delayed from the preceding signal by delay time $t_d$. At time $T_{ck}$, the latched output of each delay unit is sampled. In the depicted embodiment, the first and second delay units have already been triggered by the falling edge of signals 830a and 830b, respectively, such that the outputs of these delay units are both "0." The third and fourth delay units have not yet been triggered by the falling edge of signals 820c and 820d, respectively, such that the outputs of these delay units are both "1." Thus, the sequence latched by the latch unit 804 at time $T_{ck}$ is "0011." The time measurement of the falling edge signal, $T_{falling}$, can be calculated based on the number of delay units that are latched at "0," $C_{f1}$, using the relation $T_{falling}=C_r T_{ck} C_{f1} t_d$.

In some embodiments, the delay time produced by a delay unit of an FPGA varies based on the temperature of the FPGA. For instance, an increase in temperature may result in a decrease in the delay time. To ensure accurate measurements over a range of operating temperatures, the FPGA can be calibrated to compensate for temperature-dependent variations in delay times. In some embodiments, the calibration method involves measuring the delay time over a range of temperatures (e.g., within range from about −20° C. to about 80° C.), and using the measurement data to determine a relationship between the delay time and the temperature. The temperature of the FPGA can be measured using a temperature sensor positioned on, in, or near the FPGA. The delay time at each temperature can be determined based on the relation $t_d=T_{ck}/\text{maxbin}$, where maxbin represents the maximum number of delay units that a signal can be transmitted to within a clock period $T_{ck}$ of the FPGA. The value of maxbin for each temperature can be measured, for example, by counting the number of delay units that are triggered by a signal with a single clock period at that temperature.

The measured temperature-delay time relationship can be used to calibrate the FPGA. For example, when performing a distance measurement, the FPGA can receive a temperature value from a temperature sensor positioned on, near, or in the FPGA, and calculate the time measurement based on the temperature value. The time measurement calculation can be adjusted to compensate for different temperatures, e.g., by determining the delay time associated with the received temperature value via the measured temperature-delay time relationship, and using that delay time to calculate the time measurement.

In some embodiments, the temperature-delay time relationship used in calibration is individually measured for each FPGA for each system. Alternatively, in embodiments where chip to chip variations in temperature dependency are not large, the temperature-delay time relationship can be measured from a single FPGA and used across all systems for calibration.

In some embodiments, the FPGA is configured to perform high time resolution sampling using a plurality of phase-locked loop (PLL) clocks. Any suitable number of PLL clocks can be used, such as at least 2, at least 4, or at least 10 PLL clocks. Each PLL clock can be configured to produce a clock signal at the same clock rate, but with a different phase. For example, the clock signals can be phase-shifted from each other by $\pi/8$, $\pi/4$, $\pi/2$, or $\pi$. The FPGA can receive a plurality of digital signal values representing a digitized analog pulse signal (e.g., output by the digitizer 410 of FPGA 400) and generate a plurality of corresponding time measurements by comparing each digital signal value to the clock signals of the PLL clocks. In some embodiments, the FPGA receives a square wave signal representing changes in the value of a digital signal value over time, and uses the plurality of PLL clocks to generate a time measurement for a rising or falling edge of the square wave signal. The FPGA can use the plurality of PLL clocks to perform time measurement with a higher resolution than the clock period of the individual PLL clocks. For example, each PLL clock can have a clock rate on the nanosecond level, while the time resolution of the sampling can be on the picosecond level.

Figure 9:
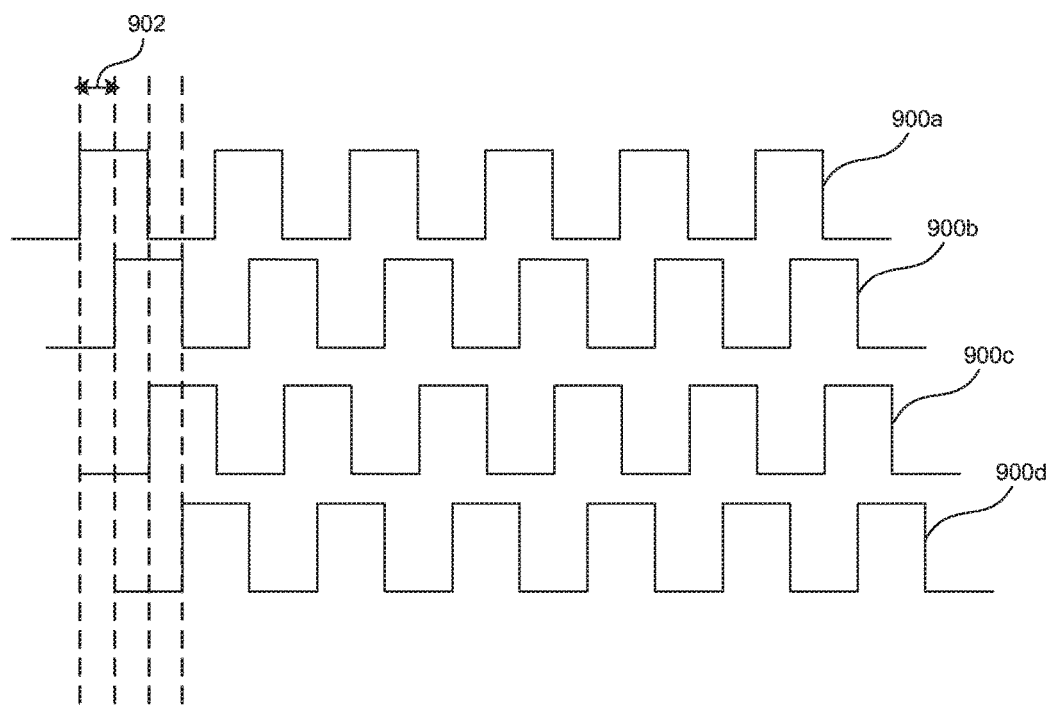
FIG. 9 illustrates a plurality of PLL clock signals used for time-to-digital conversion in accordance with embodiments of the present technology.

FIG. 9 illustrates a plurality of PLL clock signals 900a-900d used for time-to-digital conversion in accordance with embodiments of the present technology. Each clock signal has a clock period $T_{ck}$. The plurality of PLL clock signals 900a-900d are each successively phase-shifted by an amount Δ, indicated in FIG. 9 by reference number 902. For each PLL clock signal, a counter is used to count the number of clock cycles produced by the signal since the start of the measurement, C. The counter is stopped when it receives a rising edge or falling edge of the sampled signal (e.g., a square wave signal). Thus, the time measurement produced by the first PLL clock signal 900a is $CT_{ck}$, the time measurement produced by the second signal 900b is $CT_{ck}+\Delta$, the time measurement produced by the third signal 900c is $CT_{ck}+2\Delta$, the time measurement produced by the fourth signal 900d is $CT_{ck}+3\Delta$, and so on. The final time measurement for the sampled signal is the largest time measurement produced by the PLL clock signals 900a-900d.

Figure 10:
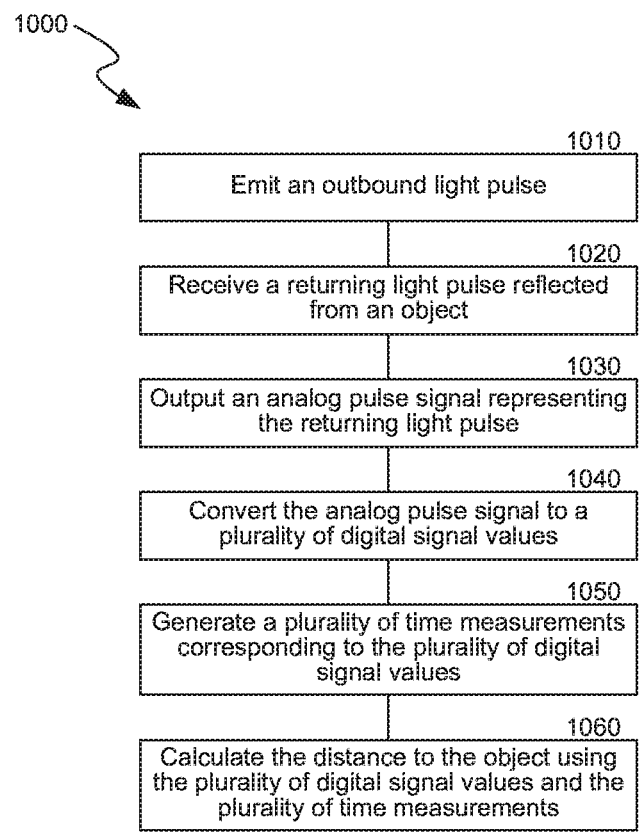
FIG. 10 illustrates a method for measuring distance to an object in accordance with embodiments of the present technology.

FIG. 10 illustrates a method 1000 for measuring distance to an object in accordance with embodiments of the present technology. Some or all of the steps of the method 1000 can be performed by any of the systems and devices described herein (e.g., the system 400). In some embodiments, some or all of the steps of the method 1000 are performed using components carried onboard a movable object, such as an unmanned vehicle (e.g., a UAV) or a robot.

In step 1010, an outbound light pulse is emitted. The light pulse can be emitted by a light emitter of a LIDAR device, e.g., light emitter 101 of FIG. 1B or light emitter 402 of FIG. 4.

In step 1020, a returning light pulse reflected from an object is received. The returning light pulse can be a reflection of the outbound light pulse from the object. The returning light pulse can be received by a light sensor of a LIDAR device, e.g., light detector 105 of FIG. 1B or light sensor 404 of FIG. 4.

In step 1030, an analog pulse signal representing the returning light pulse is outputted. For example, a light sensor of a LIDAR device (e.g., light detector 105 of FIG. 1B or light sensor 404 of FIG. 4) can be used to convert the light energy of the returning light pulse into an electrical signal.

In step 1040, the analog pulse signal is converted to a plurality of digital signal values. Step 1040 can be performed using an FPGA (e.g., by digitizer 410 of FPGA 408) as described herein. Alternatively, step 1040 can be performed using one or more comparators, as discussed with respect to FIGS. 2A, 2B. and 3. In some embodiments, the conversion involves comparing the analog pulse signal to a plurality of threshold values and generating the plurality of digital signal values based on the comparison. The conversion can be performed using a plurality of differential input ports of an FPGA, as discussed above with reference to FIGS. 5A and 5B. Optionally, step 1040 can involve compensating for offset voltages of the differential input ports, such as by applying an adjustment voltage to each differential input port that is configured to compensate for a measured offset voltage for that port.

In step 1050, a plurality of time measurements corresponding to the plurality of digital signal values is generated. Step 1050 can be performed using an FPGA (e.g., by TDC 412 of FPGA 408) as described herein. The FPGA can be the same FPGA used to perform step 1040, or can be a different FPGA. The plurality of time measurements can be generated by sampling each digital signal value with a time resolution shorter than a clock period of the FPGA. A shorter time resolution can be achieved, for example, by using a plurality of delay units to introduce successive delay times into the digital signal value, as discussed with reference to FIGS. 8A through 8C. Alternatively or in combination, a shorter time resolution can be achieved by sampling the digital signal value using a plurality of phase-shifted PLL clock signals, as described with reference to FIG. 9.

In step 1060, the distance to the object is calculated using the plurality of digital signal values and the plurality of time measurements. In some embodiments, step 1060 is performed using a controller (e.g., controller 406 of system 400). The controller may be included as part of the FPGA, or may be a separate device from the FPGA. The distance calculation can involve, for example, inputting the plurality of digital signal values and plurality of time measurements into a function, and using the function to derive an estimated time value for the returning light pulse. Optionally, the function can also utilize other input parameters, such as the measured offset voltages of the differential input ports, or an offset adjustment parameter configured to compensate for the offset voltages. The estimated time value generated by the function can then be used in a TOF calculation to determine the object distance.

Figure 11:
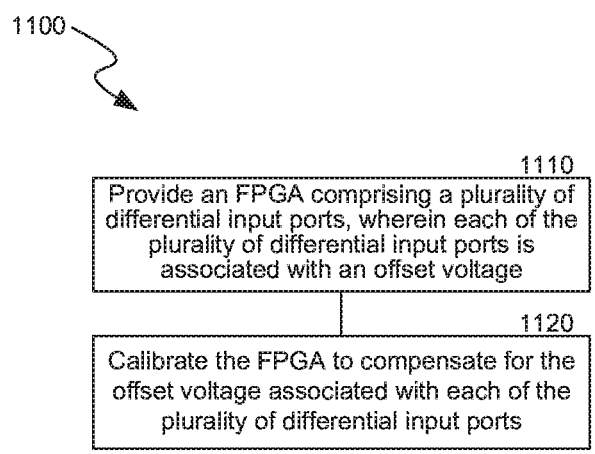
FIG. 11 illustrates a method for calibrating a distance measurement device in accordance with embodiments of the present technology.

FIG. 11 illustrates a method 1100 for calibrating a distance measurement device in accordance with embodiments of the present technology. The method 1100 can be used to calibrate any of the systems and devices described herein (e.g., system 400). In some embodiments, the method 1100 is performed prior to operating the distance measurement device. For example, the method 1100 can be performed at a manufacturing facility, or by a user (e.g., before operating the distance measurement device for the first time and/or each time after the distance measurement device is powered on).

In step 1100, an FPGA is provided. The FPGA can have a plurality of differential input ports used to perform pulse digitization, as previously discussed with respect to FIGS. 5A and 5B. Each differential input port can be associated with an offset voltage.

In step 1120, the FPGA is calibrated to compensate for the offset voltage associated with each differential input port. In some embodiments, step 1120 involves measuring the offset voltages of the differential input ports, as previously discussed. The measured offset voltage can then be used to calibrate the FPGA, e.g., by applying adjustment voltages to the differential input ports, or by using the measured offsets as input parameters into the estimated time value calculation. In other embodiments, step 1120 can be performed without measuring the offset voltages. In such embodiments, the FPGA can be calibrated by determining an offset adjustment parameter configured to compensate for the offset voltages, and using the offset adjustment voltage as an input parameter into the estimated time value calculation.

Some of the embodiments described herein are described in the general context of methods or processes, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media can include a non-transitory storage media. Generally, program modules may include routines, programs, objects, components, data structures, etc. that perform particular tasks or implement particular abstract data types. Computer- or processor-executable instructions, associated data structures, and program modules represent examples of program code for executing steps of the methods disclosed herein. The particular sequence of such executable instructions or associated data structures represents examples of corresponding acts for implementing the functions described in such steps or processes.

Some of the disclosed embodiments can be implemented as devices or modules using hardware circuits, software, or combinations thereof. For example, a hardware circuit implementation can include discrete analog and/or digital components that are, for example, integrated as part of a printed circuit board. Alternatively, or additionally, the disclosed components or modules can be implemented as an Application Specific Integrated Circuit (ASIC) and/or as a Field Programmable Gate Array (FPGA) device. Some implementations may additionally or alternatively include a digital signal processor (DSP) that is a specialized microprocessor with an architecture optimized for the operational needs of digital signal processing associated with the disclosed functionalities of this application. Similarly, the various components or sub-components within each module may be implemented in software, hardware or firmware. The connectivity between the modules and/or components within the modules may be provided using any one of the connectivity methods and media that is known in the art, including, but not limited to, communications over the Internet, wired, or wireless networks using the appropriate protocols.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a number of implementations and examples are described and other implementations, enhancements and variations can be made based on what is described and illustrated in this patent document.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A system for measuring a distance to an object, the system comprising:
 a light emitter configured to emit an outbound light pulse;
 a light sensor configured to receive a returning light pulse reflected from the object and output an analog pulse signal representing the returning light pulse;
 a field-programmable gate array (FPGA) coupled to the light sensor, wherein the FPGA includes a plurality of delay units and a plurality of latches, wherein the delay units are sequentially coupled to each other, wherein each latch is coupled to a corresponding delay unit of the plurality of delay units, and wherein the FPGA is configured to—
  convert the analog pulse signal to a plurality of digital signal values, and
  generate a plurality of time measurements corresponding to the plurality of digital signal values by sampling each digital signal value, wherein a time resolution of the sampling is shorter than a clock period of the FPGA, and wherein sampling each digital signal value includes—
   transmitting the digital signal value sequentially along the plurality of delay units;
   determining a number of the plurality of latches that were triggered during a clock cycle of the FPGA, wherein each latch is configured to be latched in response to the corresponding delay unit receiving the digital signal value; and
   calculating a time measurement corresponding to the digital signal value based on the determined number; and
 a controller configured to calculate the distance to the object based on the plurality of digital signal values and the plurality of time measurements.

2. The system of claim 1, wherein the light emitter, light sensor, FPGA, and controller are carried by an unmanned vehicle, an autonomous vehicle, or a robot.

3. The system of claim 1, wherein the time resolution is at least 5 times shorter than the clock period of the FPGA.

4. The system of claim 1, wherein the plurality of delay units comprises at least 25 delay units.

5. The system of claim 1, wherein the plurality of delay units comprises a carry chain or a lookup table (LUT).

6. The system of claim 1, wherein each of the plurality of delay units is configured to produce a delay within a range from 5 picoseconds to 2000 picoseconds.

7. The system of claim 1, further comprising a temperature sensor positioned on, in, or near the FPGA, wherein the FPGA is configured to generate the plurality of time measurements by:
 receiving a temperature value from the temperature sensor; and
 calculating the time measurement based on the temperature value.

8. The system of claim 1 wherein the field-programmable gate array (FPGA) is configured to convert the analog pulse signal to the plurality of digital signal values by (1) comparing the analog pulse signal to a plurality of threshold values and (2) generating the plurality of digital signal values based on the comparison.

9. The system of claim 8, wherein the plurality of different threshold values comprises at least 2 different threshold values.

10. The system of claim 8, wherein the FPGA comprises a plurality of differential input ports, and wherein the FPGA is configured to convert the analog pulse signal using the plurality of differential input ports.

11. The system of claim 10, wherein each differential input port comprises a low-voltage differential signaling (LVDS) interface or an emitter-coupled logic (ECL) interface.

12. The system of claim 10, wherein the FPGA is further configured to: receive the analog pulse signal and a threshold value at each of the plurality of differential input ports, wherein each differential input port receives a different threshold value.

13. The system of claim 8, wherein the controller is configured to calculate the distance by:
inputting the plurality of digital signal values and the plurality of time measurements into a function; and
deriving an estimated time value for the returning light pulse using the function.

14. The system of claim 13, wherein the function comprises a pulse signal model, and wherein the estimated time value is derived by fitting the plurality of digital signal values and the plurality of time measurements to the pulse signal model.

15. A method for measuring a distance to an object, the method comprising:
emitting, by a light emitter, an outbound light pulse;
receiving, at a light sensor, a returning light pulse reflected from the object;
outputting, by the light sensor, an analog pulse signal representing the returning light pulse;
converting, using a field-programmable gate array (FPGA), the analog pulse signal to a plurality of digital signal values;
generating, using the FPGA, a plurality of time measurements corresponding to the plurality of digital signal values by sampling each digital signal value, wherein a time resolution of the sampling is shorter than a clock period of the FPGA, and wherein sampling each digital signal value includes—
transmitting the digital signal value along a plurality of sequentially coupled delay units;
determining a number of a plurality of latches that were triggered during a clock cycle of the FPGA, wherein each latch is coupled to a corresponding delay unit of the plurality of delay units, and wherein each latch is configured to be latched in response to the corresponding delay unit receiving the digital signal value; and
calculating a time measurement corresponding to the digital signal value based on the determined number; and
calculating the distance to the object based on the plurality of digital signal values and the plurality of time measurements.

16. The method of claim 15, wherein the light emitter, light sensor, and FPGA are carried by an unmanned vehicle, an autonomous vehicle, or a robot.

17. The method of claim 15, wherein generating the plurality of time measurements comprises:
receiving a temperature value from a temperature sensor positioned on, in, or near the FPGA; and
calculating the time measurement based on the temperature value.

18. The method of claim 15 wherein converting the analog pulse signal to the plurality of digital signal values includes (1) comparing the analog pulse value to a plurality of threshold values and (2) generating the plurality of digital signal values based on the comparison.

19. The method of claim 18, wherein the FPGA comprises a plurality of differential input ports, and wherein the converting step is performed using the plurality of differential input ports.

20. The method of claim 19, further comprising: receiving the analog pulse signal and a threshold value at each of the plurality of differential input ports, wherein each differential input port receives a different threshold value.

21. The method of claim 20, wherein the analog pulse signal is received at a first pin of each differential input port and the threshold value is received at a second pin of each differential input port.

22. The method of claim 21, further comprising applying an adjustment voltage to the second pin of each differential input port, wherein the adjustment voltage is configured to compensate for an offset voltage between the first and second pins of the differential input port.

* * * * *